(12) United States Patent
Murai et al.

(10) Patent No.: US 7,718,903 B2
(45) Date of Patent: May 18, 2010

(54) COMPONENT PLACEMENT SUBSTRATE AND PRODUCTION METHOD THEREOF

(75) Inventors: Atsuhito Murai, Osaka (JP); Akiyoshi Fujii, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 663 days.

(21) Appl. No.: 11/587,051

(22) PCT Filed: Feb. 21, 2005

(86) PCT No.: PCT/JP2005/003223

§ 371 (c)(1),
(2), (4) Date: Oct. 20, 2006

(87) PCT Pub. No.: WO2005/107346

PCT Pub. Date: Nov. 10, 2005

(65) Prior Publication Data

US 2007/0217167 A1    Sep. 20, 2007

(30) Foreign Application Priority Data

Apr. 30, 2004   (JP)   ............... 2004-136173
Dec. 13, 2004   (JP)   ............... 2004-360399

(51) Int. Cl.
*H05K 1/03*   (2006.01)
(52) U.S. Cl. ...................... 174/255; 174/267
(58) Field of Classification Search ........... 174/255, 174/256, 267
See application file for complete search history.

(56) References Cited

U.S. PATENT DOCUMENTS 6,188,119 B1 *  2/2001  Ogawa et al. ............... 257/435
6,498,634 B1 * 12/2002  Yamazaki et al. ........... 349/141
6,613,399 B2    9/2003  Miyamoto et al.
6,734,029 B2    5/2004  Furusawa et al.

FOREIGN PATENT DOCUMENTS

| CN | 1204850 A | 1/1999 |
| EP | 0 989 778 A1 | 3/2000 |
| JP | 8-179113 A | 7/1996 |
| JP | 10-326559 A | 12/1998 |
| JP | 2002-164635 A | 6/2002 |
| JP | 2003-311197 A | 11/2003 |
| WO | WO-99/48339 A1 | 9/1999 |

* cited by examiner

*Primary Examiner*—Ishwarbhai B Patel
(74) *Attorney, Agent, or Firm*—Birch, Stewart, Kolasch & Birch, LLP

(57) ABSTRACT

The component placement substrate of the present invention can be produced easily with suppressed cracks in a thin film formed on a pattern film of the substrate. The present invention provides a component placement substrate provided with one or more pattern films on a substrate, wherein at least one of the pattern film(s) has a cross-sectional shape composed of a semi-elliptical circular upper part, and one of a forward taper shaped lower part and a approximately vertical taper shaped lower part and the average thickness of the lower part is 50 Å or larger and 3,000 Å or smaller.

8 Claims, 15 Drawing Sheets

PRIOR ART

PRIOR ART

PRIOR ART

PRIOR ART

PRIOR ART

PRIOR ART

PRIOR ART

COMPONENT PLACEMENT SUBSTRATE AND PRODUCTION METHOD THEREOF

TECHNICAL FIELD

The invention relates to a component placement substrate comprising patterned wirings, electrodes, insulating layers, functional films and the like formed on a substrate, its production method, and a display apparatus using the component placement substrate. More particularly, the invention relates to a component placement substrate comprising components (devices) such as wirings, electrodes, insulating layers, functional films, semiconductors, resistors, filters and the like formed on a substrate, in which all or some of the components are formed by an ink-jet (liquid droplet discharging) apparatus, its production method, and a display apparatus suitable for a liquid crystal display apparatus comprising the component placement substrate.

BACKGROUND ART

As a method for wiring formation, methods of applying liquid materials such as an ink-jet method have received attention in recent years. For example, in the case of forming a wiring by an ink-jet method, in general, it is carried out by discharging the material to form a wiring, for example a metal colloidal solution containing metal fine particles in guides (also called as banks) formed along a wiring pattern by an ink-jet apparatus and then baking the material for forming a metal wiring pattern. Such formation of a metal wiring using the ink-jet apparatus is advantageous in terms of the production efficiency and basic properties of the wiring. That is, advantageous points of the formation of a wiring by such an ink-jet method are that the method is effective to save investments with no need of apparatus for sputtering, etching and the like; to reduce waste material is improved, and formation of low resistance wiring by thickening a film of wiring is easier than a film formation method in vacuum atmosphere. The wiring substrate produced in such a manner has been investigated for application to various electronic devices, for example, widely investigated for application to substrates of display apparatus.

As previous methods for forming a wiring except methods of applying liquid materials, sputtering depositing for metal layer, photolithography and etching metal layer process shown in FIG. 12 can be exemplified, however they have no such advantages of the ink-jet methods in terms of the production efficiency and the basic properties of the wiring. Further, in such formation of a wiring, the taper shape is to be controlled depending on the etching conditions and in the case where the film thickness becomes thick, it becomes difficult to control the taper shape and in the case of inverse taper shape, the film to be formed on an upper layer, e.g. a CVD (chemical vapor deposition) film, has a crack.

With respect to a method for forming a wiring by an ink-jet method, a method for patterning surrounded region with guides formed on a substrate then filling with the material to form a wiring by an ink-jet method is disclosed (for example, reference to Patent re-publication WO99/48339 (p. 1 and 2)). In such previous guide and ink-jet methods, as shown in FIG. 13, guides 13 are formed and after that a metal colloidal solution is selectively applied between guides 13 and subjected to thermal treatment to form a wiring 4. However, cracks are formed between the guides 13 made of resin material and the metal wiring 4 and if the guides 13 are removed for preventing cracks, the cross-sectional shape of the wiring tends to be inverse taper shape. That is, the taper shape of the guides 13 is transferred to form the inverse taper shape of the cross-sectional shape of the wiring. Further, generally the thickness of the guides 13 is 1 μm (=10,000 Å) or larger, so that removal is very difficult.

Also, as another method for forming a wiring, a method involving forming lyophobic parts and liquid-repelling parts in prescribed patterns on a substrate surface using an organic molecular film, which has a self-alignment characteristic, selectively applying a liquid in which conductive fine particles are dispersed to the lyophobic parts, and converting the fine particles into a conductive film by thermal treatment to form the conductive film only in the lyophobic parts is disclosed (for example, reference to Japanese Patent Application Laid-Open No. 2002-164635 (p. 1 and 2)). In such previous self-alignment film patterning and ink-jet methods, for example as shown in FIG. 14, after patterning the self-alignment film (monomolecular film) 14, material to form a wiring, e.g. the above-mentioned metal colloidal solution, is selectively applied and subjected to the thermal treatment to form the wiring 4. However, patterning of the self-alignment film (monomolecular film) 14 is difficult, so that the productivity is considerably lowered. Accordingly, in the formation of a wiring using an ink-jet apparatus, there still remains a margin for improvements to improve the productivity and to obtain a component placement substrate with suppressed defects such as cracking by sufficiently utilizing the advantageous points of ink-jet. Such a margin for improvements is common generally in methods for applying liquid materials.

BRIEF SUMMARY OF THE INVENTION

In view of the above state of the art, it is an object of the invention to provide a component placement substrate which can be produced easily with suppressed cracks in a thin film formed on a pattern film of the substrate, its production method, and a display apparatus comprising the component placement substrate.

Based on various investigations on a component placement substrate comprising pattern films such as wiring patterns on a substrate, inventors of the invention at first have paid attention to that cracking occurs easily in a thin film layer formed on a pattern film attributed to the cross-sectional shape in the case the film thickness of the pattern film is enlarged. Consequently, inventors have noted that when the cross-sectional shape of a pattern film is composed of a semi-elliptical circular upper part and a forward or approximately vertical taper shaped lower part and the average thickness of the forward or approximately vertical taper shaped part is controlled to be 50 Å or larger and 3,000 Å or smaller, the above-mentioned problems can be solved and accordingly have accomplished the invention. Further, the inventors have found that when a pattern film is formed by forming guides for the pattern film on a substrate using a lyophobic thin film of resist and applying a liquid material to the guides of the pattern film by an ink-jet method or the like, the pattern film with such a cross-sectional shape can be produced at a high productivity and thus it is advantageous in terms of the production efficiency of a component placement substrate and basic properties of the pattern film. That is, in the invention, for example, in the case of forming a metal wiring, according to patterning of an ultra-thin film resin (lyophobic thin film) and an ink-jet method as shown in FIG. 11, after the ultra-thin film resin 2 is patterned, a metal colloidal solution 3 is selectively applied and subjected to thermal treatment to form the wiring 4. In such a manner, (1) patterning (formation of the wiring pattern) is made easy by using resist as the ultra-thin film resin to increase the productivity; (2) the ultra-thin film resin film (the lyophobic thin film) formed by using resist can be as thin as about 1,500 Å and at least the film surface has lyophobicity, so that the metal residue scarcely remains on the resist and accordingly removal (separation) after forming a wiring is made easy; and (3) since the cross-sectional shape of the wiring to be formed is made to be a upward convex plano-convex lens-like shape as shown in FIG. 11C and therefore, even if the wiring has a height of several thousand Å or more (for example, 5,000 Å), cracking in a thin film such as a CVD film to be formed on the wiring can be prevented. According to the invention, particularly, in the case the film thickness of a wiring is made large, the structure of the wiring and its production method for solving all of the possible troubles which previous techniques would encounter, can be provided.

That is, the invention is a component placement substrate provided with one or more pattern films on a substrate, wherein at least one of the pattern film(s) has a cross-sectional shape composed of a semi-elliptical circular upper part, and one of a forward taper shaped lower part and a approximately vertical taper shaped lower part and the average thickness of the lower part is 50 Å or larger and 3,000 Å or smaller.

EXPLANATION OF SYMBOLS

Figure 1A:
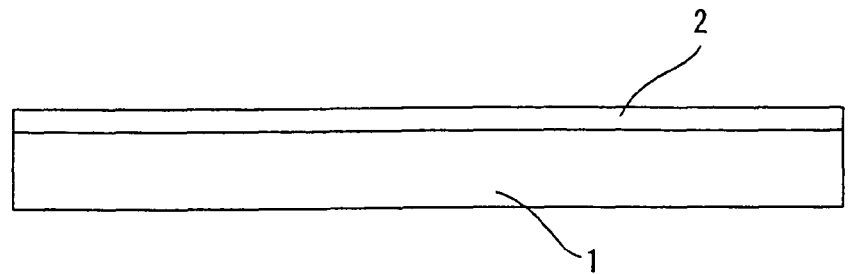
FIG. 1A is a schematic cross-sectional view showing one example of a formation flow of a wiring in the case of applying the method for forming a wiring (a pattern film) of the invention to formation of a gate wiring (at the time of forming a photosensitive resin film).

1: a transparent substrate
2: a photosensitive resin (an ultra-thin film resin film, a lyophobic thin film)
3: a metal colloidal solution (before baking)
4: a gate wiring (a metal wiring)
5: a gate insulator
6: a semiconductor layer
7: a contact layer
8: a source electrode/wiring (a metal wiring)
9: a drain electrode/wiring (a metal wiring)
10: a pixel electrode
11: a passivation film
12: a metal film
13: a guide material (a bank material)
14: a monomolecular film

DETAILED DESCRIPTION OF THE INVENTION

Hereinafter, the invention will be described in detail. In this description, "not less than" and "not more than" include the corresponding numeral values.

A component placement substrate of the invention is provided with a patterned film (a pattern film) on a substrate. The component placement substrate of the invention may comprise two or more pattern films of different types. The above-mentioned pattern film is not particularly limited and preferably composing components and more preferably composing at least one kind of components selected from a group consisting of a wiring, an electrode, an insulating layer, and a functional film, and among them, even more preferably composing a wiring. The above-mentioned functional film is not particularly limited as long as they can exhibit any functions based on electric, optical, mechanical, thermal, chemical, biological properties and may include an organic layer such as a light emitting layer and a positive hole injection layer in an organic EL (electro luminescent) device. The length and the plane shape of the pattern film are not particularly limited.

The constitution of the component placement substrate of the invention may or may not contain other constituent elements as long as it comprises a substrate and a pattern film as indispensable constituent elements and thus it is not particularly limited. The component placement substrate may be called as a wiring substrate in the case it has a wiring as a component (a device).

At least one of the above-mentioned pattern film(s) has a cross-sectional shape composed of a semi-elliptical circular upper part, and one of a forward taper shaped lower part and a approximately vertical taper shaped lower part and the average thickness of the lower part is 50 Å or larger and 3,000 Å or smaller. Generally, the semi-elliptical circular shape part and the forward or approximately vertical taper shaped part are formed in a unified manner at the time of forming a pattern film and should be distinguished only based on their shapes using the substrate side to be a base as their lower parts at the time of forming a pattern film. In such an invention, the cross-sectional upper part of a pattern film is made to be the semi-elliptical circular part and the forward or approximately vertical taper shaped part of the cross-sectional lower part is made to be thin, namely the cross-sectional shape of the pattern film is made to be a upward convex plano-convex lens-like shape, so that cracking in a thin film such as a CVD film to be formed on the pattern film can be suppressed even if the pattern film is made to be thick. The forward or approximately vertical taper shaped part is generally preferable to have an average thickness as small as possible, however if it is smaller than 50 Å, a guide material thickness is required to be smaller than 50 Å in the case of forming a pattern film and therefore a film of resist cannot be used as the guide material to result decreasing in the production efficiency of the component placement substrate. On the other hand, if it exceeds 3,000 Å, the effects of the invention for suppressing cracking cannot sufficiently be exhibited. A preferable lower limit is 500 Å and a preferable upper limit is 2,000 Å. Although it depends on the material characteristics of resin such as heat resistance, the thin film of resist may or may not be removed after forming the wiring and is preferable to be removed. In the invention, the semi-elliptical circular part may have a cross-sectional shape substantially evaluated as semi-elliptical circular shape as long as the effects of the invention are provided and, in particular, it is preferable that the semi-elliptical circular part has a cross-sectional shape in which a center part corresponds to a summit part and the other parts slant downward from the summit part to both end parts. The forward or approximately vertical taper shaped part is a cross-sectional shape with so-called taper shape in which the pattern width is narrowed upward or a cross-sectional shape with so-called approximately vertical taper shape in which the pattern width is approximately constant upward and the approximately vertical taper shaped part may be a cross-sectional shape with so-called inverse tapered shape in which the pattern width is widened upward as long as the effects of the invention are provided.

At least one of the pattern film(s) is preferable to have an average film thickness of 2,000 Å or larger. Accordingly, the pattern film (structure of the wiring) excellent in the basic properties can be obtained and the effects of the invention that no crack is formed in the pattern film can be exhibited sufficiently. More preferable lower limit and upper limit are 3,000 Å and 6,000 Å, respectively. The average film thickness is the average value in the points where the thickness of the cross sectional shape of the pattern become the maximum.

At least one of the pattern film(s) is preferable to be formed by applying a liquid material to the inside of a guide pattern composed of a thin film of resist. Accordingly, formation of the pattern film and removal (separation) of the thin film of resist composing the guide pattern after the formation can be carried out easily, so that an advantageous effect in terms of the production efficiency of the component placement substrate can be achieved. As the resist, generally a resin composition containing photosensitive resin is to be used and for example, those which can be applied on a substrate to be a film and patterned in a desired pattern by a photolithographic method can be employed. The thin film of resist is preferably a lyophobic thin film having lyophobicity and practically, in the case of a thin film of resist (a guide material) for formation of wiring pattern, it is preferable that the film has a contact angle of 50° or higher to a metal colloidal solution. As the solvent (dispersant) for the metal colloidal solution, practically, alcohols and carbitol type solvents (dispersants) may be used in the case of forming the wiring by an ink-jet method and additionally, water-based solvents (dispersants) may be used in addition to the above-mentioned solvents (dispersants) in the case of forming the wiring by dipping (DIP) method, a spin-coating method, a die coat method and others. The above-mentioned solvents (dispersants) may also be used as the solvents (dispersants) for materials for forming oxide conductors such as indium tin oxide (ITO) and insulating layer patterns, not limited for the materials to form a wiring and therefore, also in the case of its use for the formation of an electrode pattern and an insulating layer pattern, the thin film of resist is preferable to have a contact angle of 50° or higher to a solution containing the above-mentioned solvents (dispersants). In the case the above-mentioned solvents (dispersants) are used as the solvent (dispersant), as the lyophobic thin film of resist, (1) those which are formed using lyophobic resist having lyophobicity and (2) those which are formed using resist having no lyophobicity and provided with lyophobicity by plasma treatment using a fluorine-based gas are preferable. In a case of employing such formation method of a pattern film, the shape of the cross-sectional lower part of the pattern film is a reverse (inverted) shape of the thin film of resist composing the guide pattern and has an approximately same thickness as that of the thin film of resist. The thin film of resist is preferable to have an average film thickness of 3,000 Å or smaller. If it exceeds 3,000 Å, the effect of the invention for suppressing cracks may not be exhibited sufficiently. A more preferable lower limit is 500 Å and a more preferable upper limit is 2,000 Å. As the method for applying the liquid material of the pattern film to inside of a guide pattern, an ink-jet method, a spin-coating method, and a doctor blade method can be exemplified, and among them, the ink-jet method is preferable to be employed.

At least one of the above-mentioned pattern film(s) is preferable to be covered with a thin film of inorganic material. Making a multilayer structure of the part where a pattern film is formed by coating the pattern film with the inorganic material makes it possible to sufficiently exhibit the effect of the invention for preventing cracks in the thin film of the pattern film upper layer and also to use the component placement substrate of the invention as an active matrix substrate of a liquid crystal display apparatus by installing a thin film transistor (TFT) and others. As the thin film of inorganic material, those which are formed by a vacuum evaporation method or a chemical vapor deposition method are preferable. In such a case, the effect of the invention can be exhibited sufficiently. More particularly, for example, layers composing a thin film transistor such as a gate insulator, a semiconductor layer (a-Si), a contact layer ($n^+$ type a-Si), an insulating protection layer (a passivation film) and the like can be exemplified. The average thickness of the inorganic thin film is generally in a range of 3,000 Å to 5,000 Å.

The invention also provides a production method of a component placement substrate comprising one or more pattern films on a substrate containing a step of forming one or more guide patterns, which is disposed for forming the pattern film(s), by lyophobic thin film of resist and a step of forming pattern film(s) by applying a liquid material to the inside of the guide pattern(s). The above-mentioned pattern film(s) is not particularly limited and is preferably at least one kind of film(s) selected from a group consisting of a wiring, an electrode, an insulating layer, and a functional film, and among them, the pattern film(s) is more preferably a wiring(s). Accordingly, at the time of producing the component placement substrate, formation of pattern film(s) of such as a wiring, an electrode, an insulating layer, and a functional film and removal (separation) of the lyophobic thin film of resist after the formation can be easily carried out to result in an advantageous effect in terms of production efficiency of the component placement substrate and moreover, it is made possible to suppress cracks in a thin film such as a CVD film to be formed on a wiring by making the lyophobic thin film of resist sufficiently thin even if the pattern film is made thick.

In the invention, as the above-mentioned lyophobic thin film of resist, those which is formed by providing lyophobicity for a thin film of resist (having no lyophobicity) by plasma treatment using a fluorine-based gas or those which is formed using a resist having lyophobicity (lyophobic resist) are preferable in terms of productivity and in the case of a thin film of resist (a guide material) for formation of a wiring pattern, it is preferable to have a contact angle of 50° or higher to a metal colloidal solution. Also, with respect to other thin films of resist (guide materials) not limited to the thin film of resist (a guide material) for formation of a wiring pattern, they are preferable to have a contact angle of 50° or higher fluorine-based gas to be used for the plasma treatment, any gas can be used without any particular limit as long as it contain fluorine atom and gases such as $CF_4$, $SF_6$ and these gases diluted with $N_2$, He or the like are preferable to be used.

The resist is preferable to comprise resin solid matter in the proportion of 10% by weight or more. If it is less than in the portion of 10% by weight, defects such as pinholes may probably be caused in a formed lyophobic thin film. Also, the resist is preferable to comprise resin solid matter in the proportion of 30% by weight or less. If it exceeds 30% by weight, the viscosity of the resist increases to possibly make it impossible to form a lyophobic thin film with about 3,000 Å thickness preferably in the thicker side. The resist with a resin solid matter in the portion of 10% by weight or more and in the portion of 30% by weight or less is preferable to form a lyophobic thin film with a thickness of 50 Å or larger and 3,000 Å or smaller. A more preferable lower limit of the resin solid matter of the resist having lyophobicity is in the portion of 15% by weight and a more preferable upper limit is in the portion of 25% by weight.

The above-mentioned lyophobic thin film of resist is preferable to have an average film thickness of 50 Å or larger and 3,000 Å or smaller. Accordingly the effect of the invention for suppressing cracks and others can be exhibited sufficiently. A more preferable lower limit and a more preferable upper limit are 500 Å or larger and 2,000 Å or smaller, respectively. The above-mentioned step of forming the pattern films is preferable to be carried out by an ink-jet method. Accordingly, an advantageous effect in terms of the production efficiency of the component placement substrate and basic properties of the pattern film can be achieved.

Figure 11A:
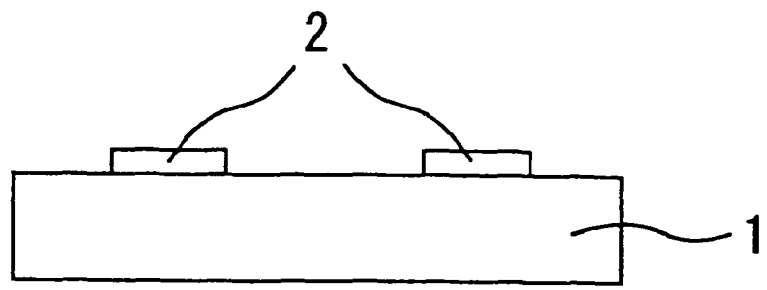
FIG. 11A is a schematic cross-sectional view showing a portion of a wiring pattern with respect to one embodiment of a production method of a component placement substrate of the invention. (a patterning step of an ultra-thin film resin film).
Figure 11B:
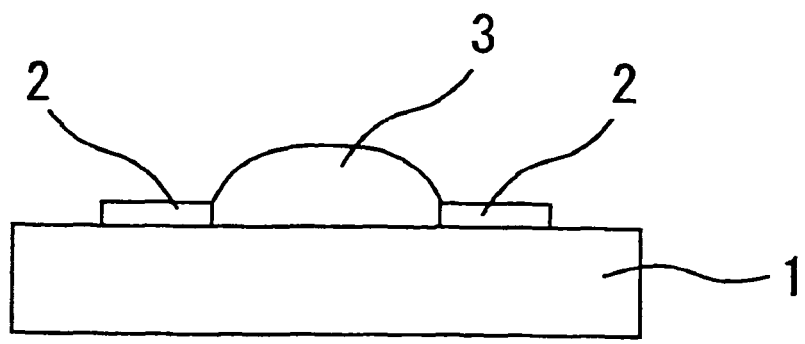
FIG. 11B is a schematic cross-sectional view showing a portion of a wiring pattern with respect to one embodiment of a production method of a component placement substrate of the invention. (a selective application and thermal treatment step of a metal colloidal solution).
Figure 11C:
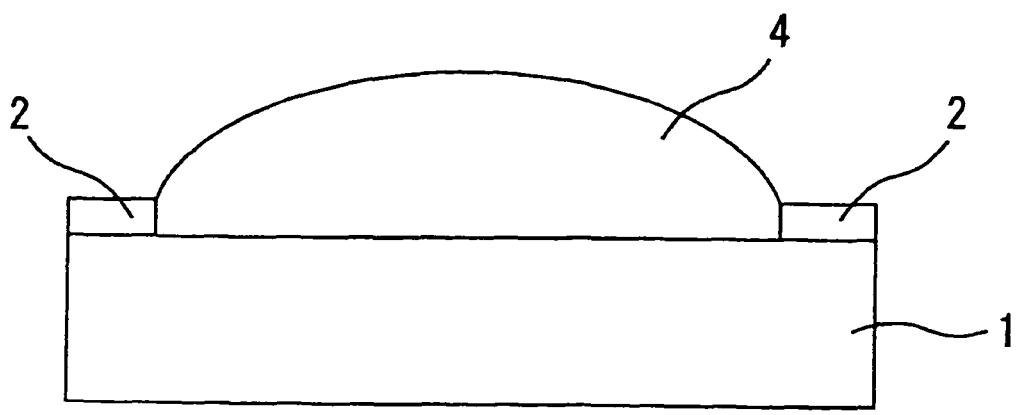
FIG. 11C is a schematic cross-sectional view showing a portion of a wiring pattern with respect to one embodiment of a production method of a component placement substrate of the invention. (at the time of forming a wiring).
Figure 12A:
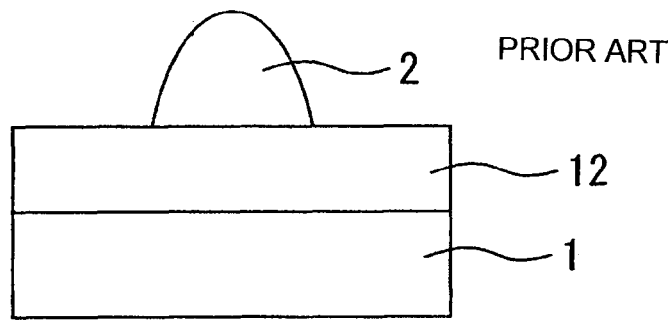
FIG. 12A is a schematic cross-sectional view showing a portion of a wiring pattern with respect to one example of a previous sputtering and photolithographic method (at the time of forming a photosensitive resin pattern).
Figure 12B:
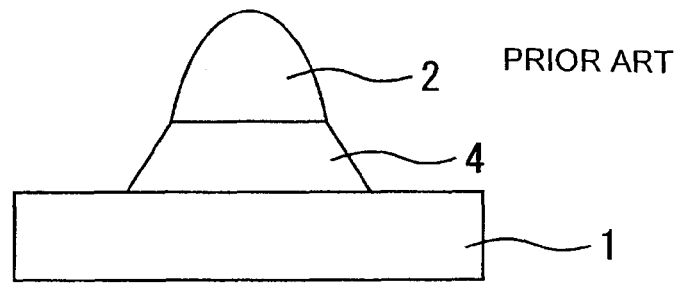
FIG. 12B is a schematic cross-sectional view showing a portion of a wiring pattern with respect to one example of a previous sputtering and photolithographic method (at the time of etching a metal layer).
Figure 13A:
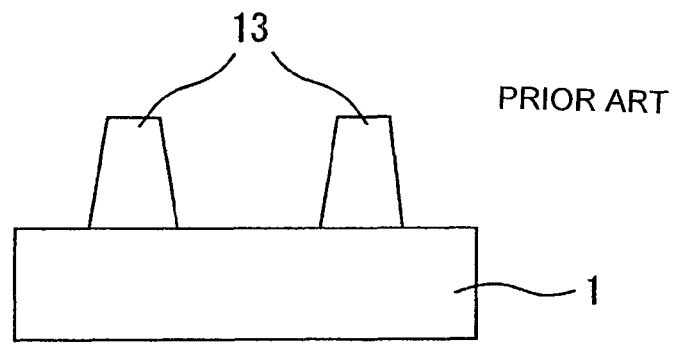
FIG. 13A is a schematic cross-sectional view showing a portion of a wiring pattern with respect to one example of a previous guide and ink-jet method (at the time of forming a guide material pattern).
Figure 13B:
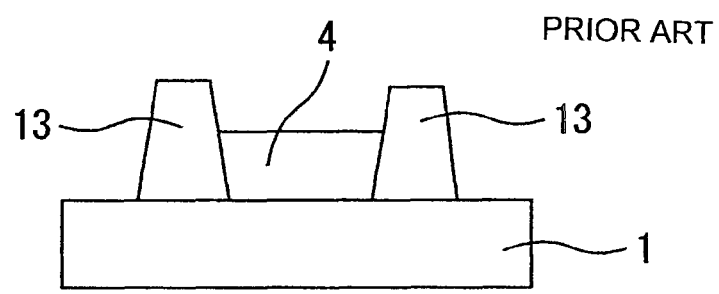
FIG. 13B is a schematic cross-sectional view showing a portion of a wiring pattern with respect to one example of a previous guide and ink-jet method (at the time of forming a metal wiring).
Figure 14A:
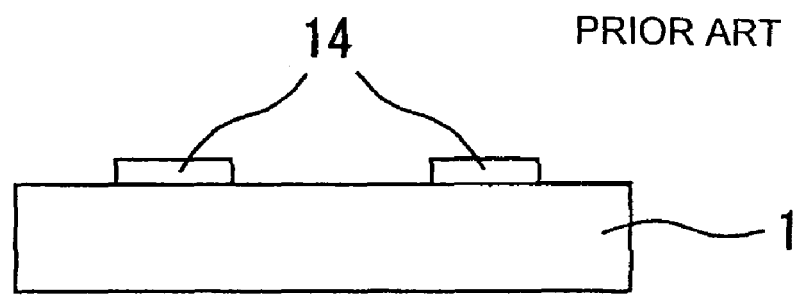
FIG. 14A is a schematic cross-sectional view showing a portion of a wiring pattern with respect to one example of a previous self-alignment film patterning and ink-jet method (at the time of forming a monomolecular film pattern).
Figure 14B:
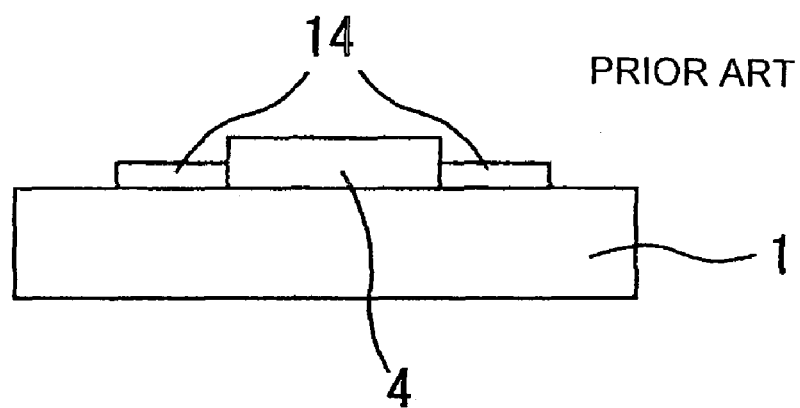
FIG. 14B is a schematic cross-sectional view showing a portion of a wiring pattern with respect to one example of a previous self-alignment film patterning and ink-jet method (at the time of forming a metal wiring).

With respect to one embodiment of a production method of a component placement substrate of the invention, a schematic cross-sectional view of a part of a wiring pattern is shown in FIG. 11. FIG. 11 shows formation of a wiring 4 (reference to FIG. 11C) with an upward convex plano-convex lens-like cross-sectional shape by patterning an ultra-thin film resin film (a lyophobic thin film of resist) 2 (reference to FIG. 11A), thereafter selectively applying a metal colloidal solution 3 in a space surrounded with the resin films 2 and then subjecting the solution to thermal treatment (reference to 11B).

In the above-mentioned production method, as an outline of the process flow for producing a TFT array wiring substrate in a liquid crystal display apparatus, in general, the following respective steps are carried out: (1) washing of a substrate before process; (2) formation of a gate wiring; (3) depositing gate insulator on the gate wiring and then forming a semiconductor layer; (4) formation of a source/drain wiring; (5) depositing a protection film (passivation film) and then disposing a photosensitive resin layer; (6) formation of a pixel electrode; and (7) final inspection for the substrate. In the steps of forming a gate wiring and a source/drain wiring in such process flow, the wiring is formed by the above-mentioned method for forming a wiring. In such a case, the lyophobic thin film of resist in the invention may be used as a guide material for the formation of a wiring pattern.

To describe one example of such process flow, a lyophobic thin film of resist is formed on a substrate, which is washed in the step of washing the substrate before process, in the step (2) of forming a gate wiring: and a gate electrode and a wiring is formed by forming a guide pattern by a photolithographic method, thereafter filling the guide pattern with a liquid wiring material by an applying method such as an ink-jet method, and then baking the wiring material. At that time, a wiring for storage capacitor (Cs wiring) is simultaneously formed. After forming the wiring, the lyophobic thin film of resist (the guide pattern) is removed (separated). In the above-mentioned step (3) of depositing gate insulator on the gate wiring and then forming a semiconductor layer, a gate insulator of such as $SiN_x$, a semiconductor layer of such as a-Si, and a contact layer of such as $n^+$-type a-Si are successively formed and further, the semiconductor layer and the contact layer are patterned in desired patterns. In the above-mentioned step (4) of forming a source/drain wiring, by a method similar to the method used in the step of forming a gate wiring, the source electrode and a wiring and the drain electrode and wiring are formed on the contact layer. In the above-mentioned step (5) of depositing a protection film (passivation film) and then disposing a photosensitive resin layer, a film of such as $SiN_x$ is formed in a non-display region. In the above-mentioned step (6) of forming a pixel electrode, a pixel electrode of such as indium tin oxide (ITO) is formed in a display region. In the above-mentioned step (7) of finally inspecting a substrate, existence of pattern defects of the wirings is inspected.

The invention further provides a display apparatus comprising the component placement substrate of the invention or a component placement substrate produced by the production method of the component placement substrate of the invention. The display apparatus is not particularly limited as long as it can control display by a method of such as supplying electric signals to the wirings of the component placement substrate. As such the display apparatus, a liquid crystal display apparatus and an organic-electro luminescent (EL) display apparatus can be exemplified, and among them, a liquid crystal display apparatus is preferable. Accordingly, an advantageous effect in terms of production efficiency, yield, and reliability can be achieved.

Next, a substrate composing the component placement substrate, a liquid material to be applied to the guide pattern, and application conditions will be described.

As the substrate, for example, a silicon (Si) wafer, quartz glass, glass, a plastic film, a metal plate and the like can be employed and also a semiconductor film, a metal film, a dielectric film, an organic film and the like may be formed as an under layer for a wiring on the surface of a substrate.

Among liquid materials, as a wiring and electrode material, usable examples are liquid materials obtained by dispersing silver, copper, gold, palladium, nickel or alloy thereof in solvents (dispersants), liquid materials obtained by dispersing conductive fine particles of such as indium tin oxide (ITO) in solvents (dispersants), liquid materials capable of producing metals by chemical reaction such as reduction after application, and conductive polymers and liquid materials obtained by dispersing the conductive polymers in solvents (dispersants). Also, as an insulating layer material, usable examples are sol-gel materials and liquid materials obtained by dispersing metal fine particles and oxide fine particles in the sol-gel materials. Further, as material for a functional film, usable examples are organic EL materials, and organic semiconductive materials such as PEDOT (poly(ethylenedioxythiophene)) to be used for carrier injection to the organic-EL layer. Among them, those having characteristics suitable for application by the ink-jet method are preferable.

The application conditions may properly be adjusted depending on the film thickness of the desired pattern films, composition and characteristics of the liquid materials, the material of the substrate and the like, and are not particularly limited.

The component placement substrate of the invention has the above-mentioned constitution and since the cross-sectional shape of a pattern film is composed of a semi-elliptical circular upper part and a forward or approximately vertical taper shaped lower part, cracking in a thin film of such as a CVD film to be formed on the pattern film can be suppressed by forming the forward or approximately vertical taper part to be thin even if the pattern film is made thick. Such a component placement substrate of the invention can be used suitably for a TFT array wiring substrate in a display apparatus such as a liquid crystal display apparatus and provides an advantageous effect in terms of production efficiency, yield, and reliability.

BEST MODE FOR CARRYING OUT THE INVENTION

Hereinafter the invention is described further in detail, however it is not intended that the invention be limited to the illustrated embodiments.

Example 1

FIG. 1 is a schematic cross-sectional view showing one example of formation flow of a wiring in the case of applying formation method of a wiring (a pattern film) of the invention to formation of a gate wiring. FIG. 2A is a schematic cross-sectional view showing the case of film formation of a gate insulator/a semiconductor layer/a contact layer on a gate wiring formed as shown in FIG. 1. FIG. 2B is a schematic plane view of a pixel part having TFT device using the gate wiring formed as shown in FIG. 1. FIG. 2C is a schematic cross-sectional view of a portion cut along A-A' line in FIG. 2B.

Figure 1B:
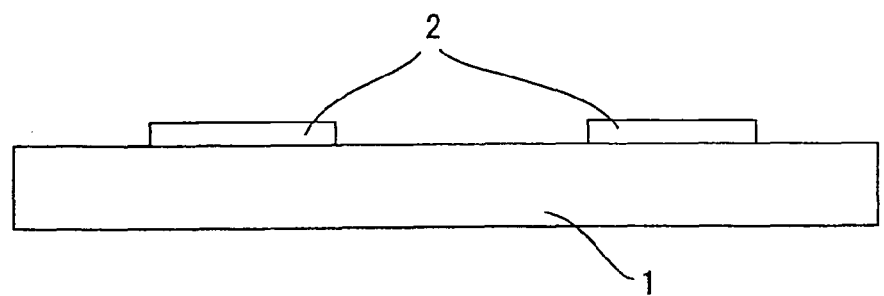
FIG. 1B is a schematic cross-sectional view showing one example of a formation flow of a wiring in the case of applying the method for forming a wiring (a pattern film) of the invention to formation of a gate wiring (at the time of patterning a photosensitive resin).
Figure 1C:
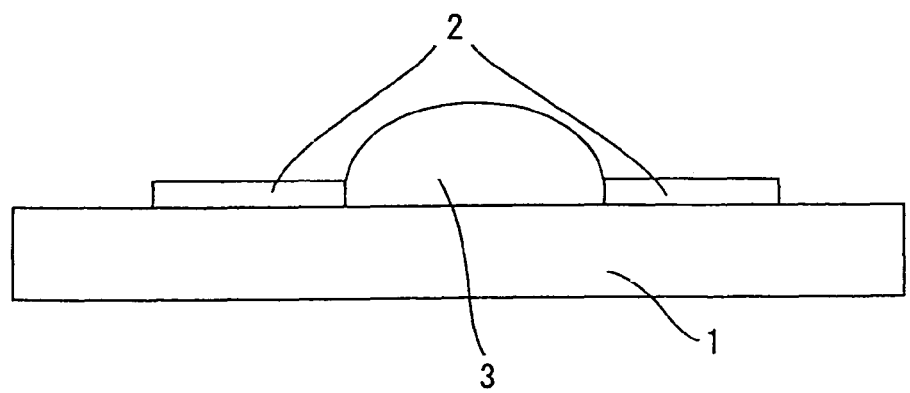
FIG. 1C is a schematic cross-sectional view showing one example of a formation flow of a wiring in the case of applying the method for forming a wiring (a pattern film) of the invention to formation of a gate wiring (at the time of disposing a colloidal solution).
Figure 1D:
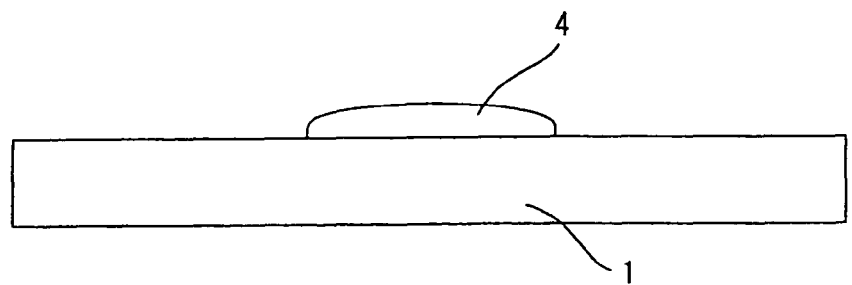
FIG. 1D is a schematic cross-sectional view showing one example of a formation flow of a wiring in the case of applying the method for forming a wiring (a pattern film) of the invention to formation of a gate wiring (at the time of processing a channel portion of thin film transistor).
Figure 2A:
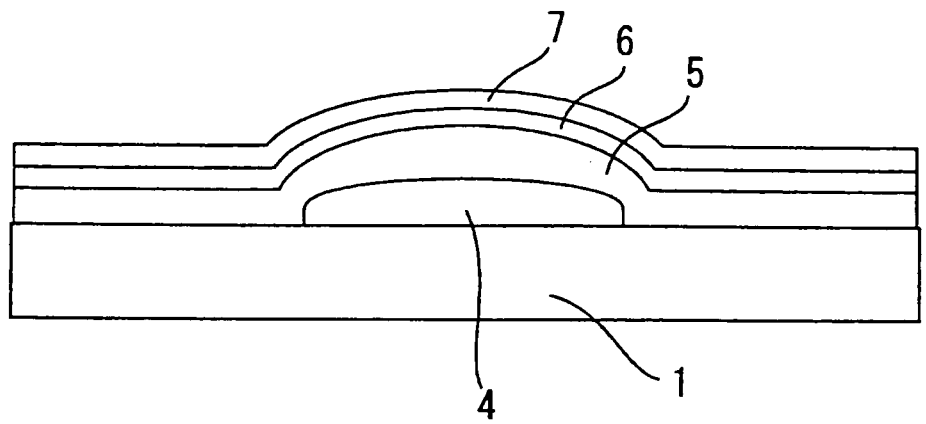
FIG. 2A is a schematic cross-sectional view showing the case of film formation of a gate insulator/a semiconductor layer/a contact layer on a gate wiring formed as shown in FIG. 1.
Figure 2B:
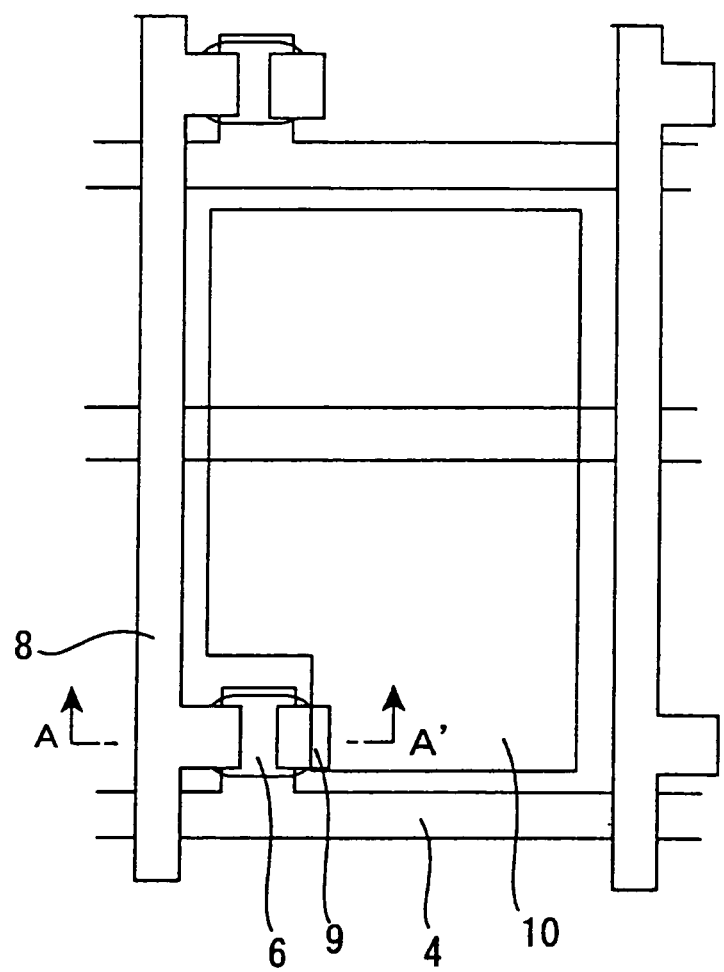
FIG. 2B is a schematic plane view of a pixel part having TFT device using the gate wiring formed as shown in FIG. 1.
Figure 2C:
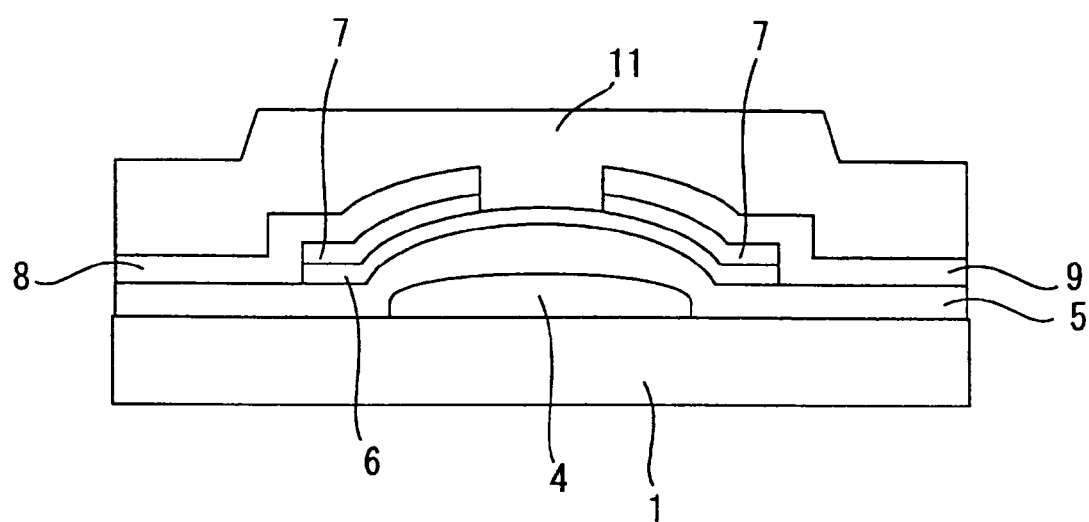
FIG. 2C is a schematic cross-sectional view of a portion cut along A-A' line in FIG. 2B.
Figure 3A:
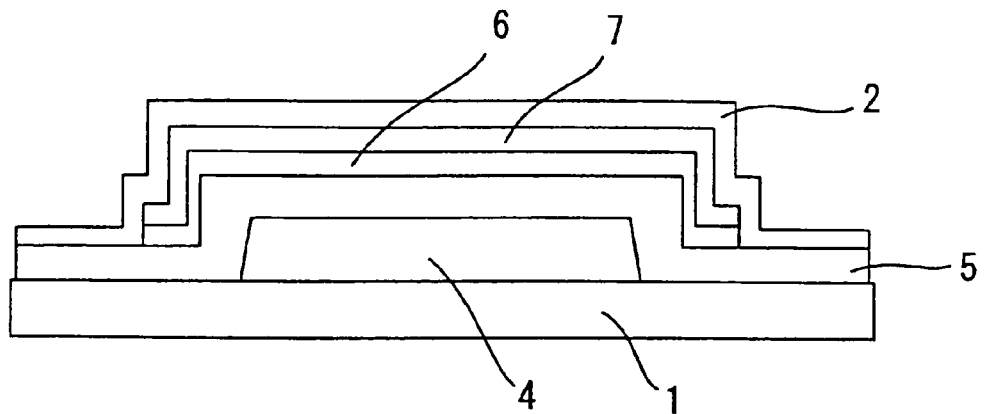
FIG. 3A is a schematic cross-sectional view showing one example of a formation flow of a wiring in the case of applying the method for forming a wiring (a pattern film) of the invention to formation of a source-drain wiring (at the time of forming a photosensitive resin film).
Figure 3B:
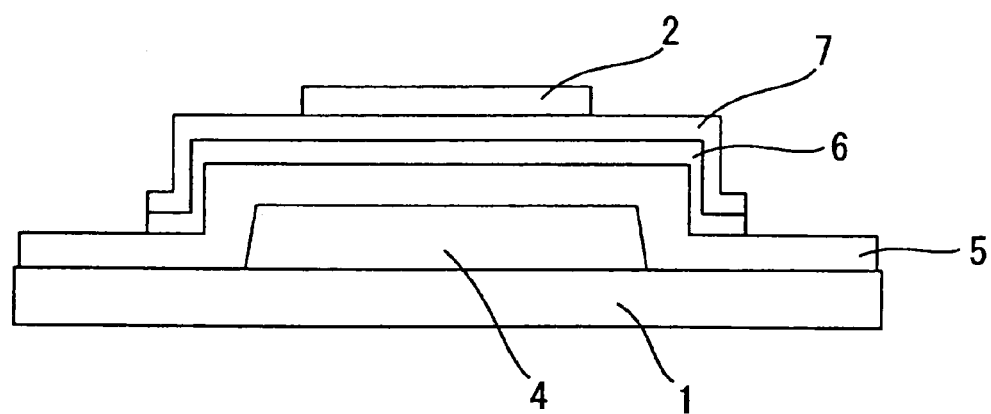
FIG. 3B is a schematic cross-sectional view showing one example of a formation flow of a wiring in the case of applying the method for forming a wiring (a pattern film) of the invention to formation of a source-drain wiring (at the time of patterning a photosensitive resin).
Figure 3C:
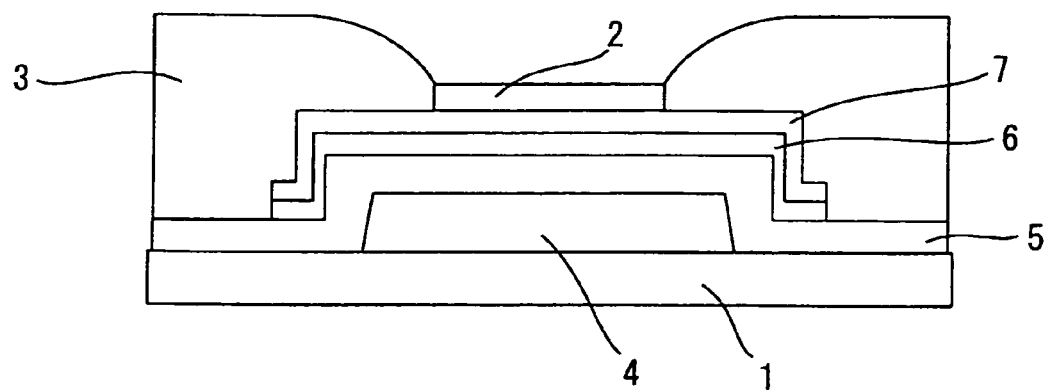
FIG. 3C is a schematic cross-sectional view showing one example of a formation flow of a wiring in the case of applying the method for forming a wiring (a pattern film) of the invention to formation of a source-drain wiring (at the time of disposing a colloidal solution).
Figure 3D:
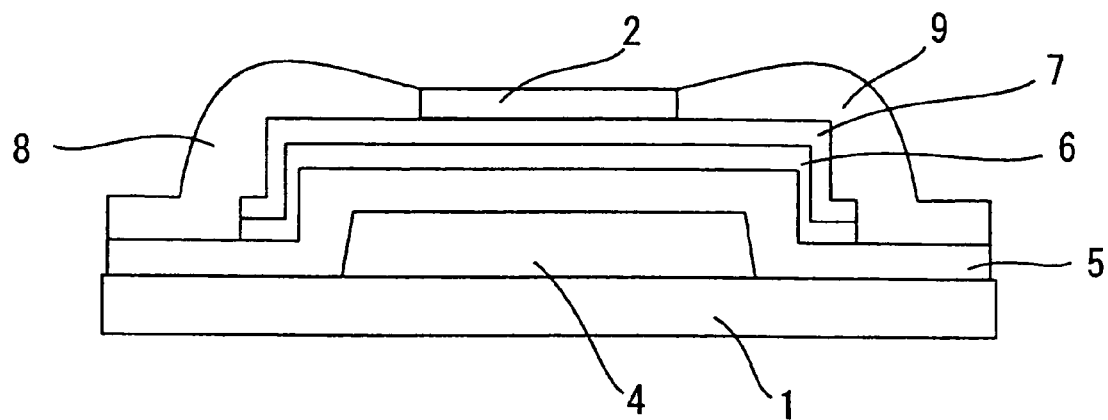
FIG. 3D is a schematic cross-sectional view showing one example of a formation flow of a wiring in the case of applying the method for forming a wiring (a pattern film) of the invention to formation of a source-drain wiring (at the time of disposing a metal wiring).
Figure 3E:
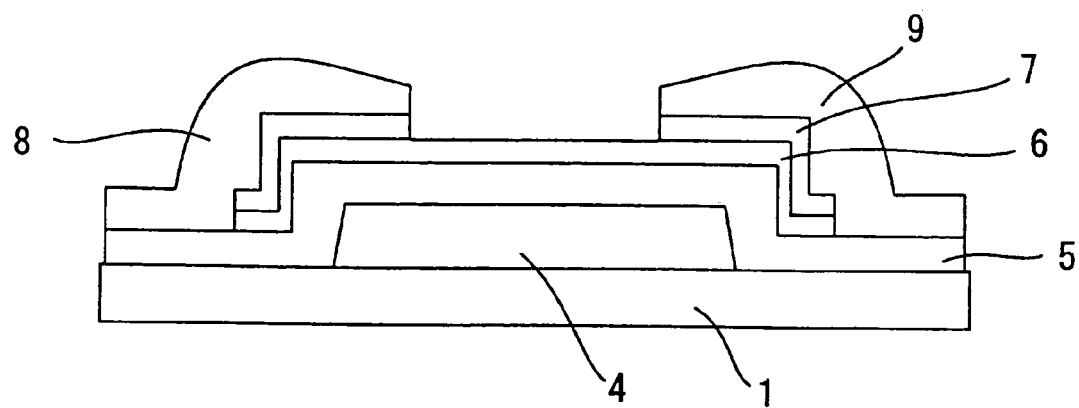
FIG. 3E is a schematic cross-sectional view showing one example of a formation flow of a wiring in the case of applying the method for forming a wiring (a pattern film) of the invention to formation of a source-drain wiring (at the time of processing a channel portion of thin film transistor).

In formation flow of the gate wiring according to the formation method of a wiring of the invention, at first a negative type photosensitive resin (resist) 2 having lyophobicity (resin solid matter in the portion of 25% by weight) is formed in an average film thickness of 700 Å or lager and 1,500 Å or smaller on a transparent substrate 1 (reference to FIG. 1A) and then the photosensitive resin 2 is patterned in a desired pattern (resin width 30 μm and aperture width 30 μm) by a photolithographic method (reference to FIG. 1B). Next, a colloidal solution 3 containing silver (Ag), copper (Cu) or alloy thereof is disposed in a region where the photosensitive resin 2 is not formed by an ink-jet method, a spin-coating method, or dipping method (reference to FIG. 1C). After that, the solution is baked at 300° C. for about 1 hour to form a metal wiring 4 with an average film thickness of 3,000 Å and then the photosensitive resin 2 is removed to complete formation of the gate wiring 4 (reference to FIG. 1D). The gate wiring 4 formed by this Example has a cross-sectional shape composed of a semi-elliptical circular upper part and a forward or approximately vertical taper shape lower part and the average thickness of the forward or approximately vertical taper shaped part has an average thickness of 700 Å or larger and 1,500 Å or smaller.

Successively, a gate insulator 5 (average film thickness 3,500 Å), a semiconductor layer 6 (average film thickness 1,500 Å), and a contact layer 7 (average film thickness 1,000 Å) are successively formed on the obtained gate wiring 4 (reference to FIG. 2A) and further the semiconductor layer 6 and the contact layer 7 are patterned in desired patterns (reference to FIGS. 2B and 2C). As shown in FIG. 2A, at that time, in this embodiment, films can be formed with good step coverage (the step-covering property). After that, a source electrode-wiring 8, a drain electrode-wiring 9, a channel part, a pixel electrode 10, and a passivation film 11 may be formed to produce a TFT device (reference to FIGS. 2B and 2C).

Example 2

Figure 4A:
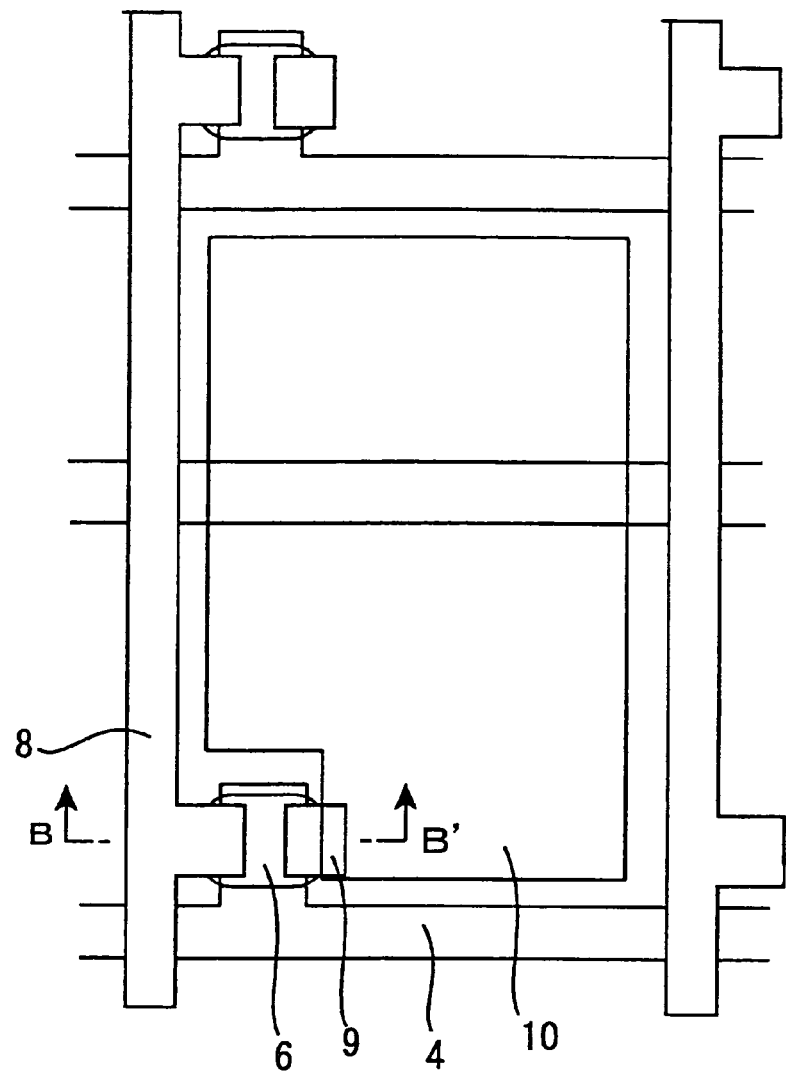
FIG. 4A is a schematic plane view of a pixel part having TFT device using the source-drain wiring formed as shown in FIG. 3.
Figure 4B:
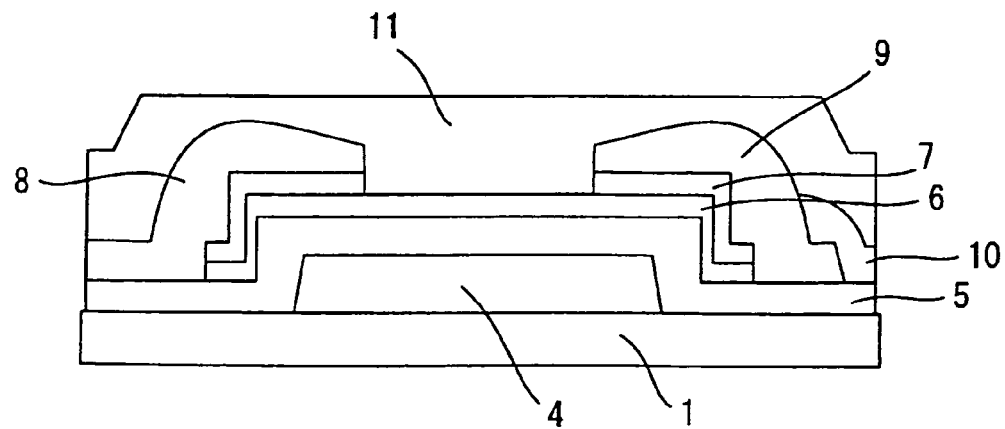
FIG. 4B is a schematic cross-sectional view of a portion cut along B-B' line in FIG. 4A.

FIG. 3 is a schematic cross-sectional view showing one example of formation flow of a wiring in the case of applying a wiring (a pattern film) formation method of the invention to formation of a source-drain wiring. FIG. 4A is a schematic plane view of a pixel part having TFT device using the source-drain wiring formed as shown in FIG. 3. FIG. 4B is a schematic cross-sectional view of a portion cut along B-B' line in FIG. 4B.

In this Example, at first a gate wiring 4 is formed on a transparent substrate 1, thereafter, a gate insulator 5, a semiconductor layer 6, and a contact layer 7 are formed and then the semiconductor layer 6 and the contact layer 7 are patterned into desired patterns by the photolithographic method to form a substrate before formation of the source-drain wiring. Successively, in formation flow of the source-drain wiring by formation method of the wiring of the invention, a negative type photosensitive resin (resist) 2 having lyophobicity (resin solid matter in the portion of 25% by weight) is formed in an average film thickness of 700 Å or larger and 1,500 Å or smaller on the contact layer 7 (reference to FIG. 3A) and then the photosensitive resin 2 is patterned in a desired pattern (resin width 10 μm and aperture width 10 μm) by the photolithographic method (reference to FIG. 3B). Next, a colloidal solution 3 containing silver (Ag), copper (Cu) or alloy thereof is disposed by an ink-jet method, a spin-coating method, or dipping method in a region where the photosensitive resin 2 is not formed (reference to FIG. 3C). After that, the solution is baked at 300° C. for about 1 hour to form a metal wiring 8 and 9 with an average film thickness of 3,000 Å (reference to FIG. 3D) and then the photosensitive resin 2 and the contact layer 7 under the resin are removed to complete formation of the source electrode and wiring 8 and the drain electrode and wiring 9 (reference to FIG. 3E). After that, the channel part, the pixel electrode 10, the passivation film 11 and the like are formed to produce a TFT device (reference to FIGS. 4A and 4B). The source electrode and wiring 8 and the drain electrode and wiring 9 formed by this Example have a cross-sectional shape composed of a semi-elliptical circular upper part and a forward or approximately vertical taper shaped lower part and the average thickness of the forward or approximately vertical taper shape part has an average thickness of 700 Å or larger and 1,500 Å or smaller.

In Examples 1 and 2, although the negative type photosensitive materials are used as the photosensitive resin material 2, positive type photosensitive material may be used. Also, although the photosensitive materials with lyophobicity are used as the photosensitive resin material 2, the photosensitive material 2 provided with lyophobicity may be formed by forming film using a photosensitive material having no lyophobicity and then carrying out plasma treatment using a fluorine-based gas ($CF_4$, $SF_6$ and these gases diluted with $N_2$, He or the like) for the formed thin film. Plasma treatment may be carried out by a method using a vacuum evacuation type dry etching apparatus (introduced gas flow rate: $CF_4/H_2$= (150 to 300)/(0 to 500) sccm; treatment pressure: 50 to 150 mTorr; treatment power: 200 to 300 W; processing time: 60 to 120 sec; and temperature: 40° C.) and a method using an atmospheric plasma apparatus (introduced gas flow rate:

$CF_4/H_2$=(5.0 to 15 slm)/(20 to 50 slm); treatment power: 300 to 800 W; substrate transportation speed: 0.5 to 3 m/min; and temperature: 25 to 35° C.).

Additionally, also in the case of providing lyophobicity for the thin film patterned by using a positive type photosensitive resin 2 by plasma treatment using a fluorine-based gas, the same effects as those of Examples 1 and 2 can be achieved.

(Experiment 1)

This experiment was carried out for confirming the correlation between the average film thickness (the height of the lower part of a wiring) of a photosensitive resin (resist) and the state of crack occurrence in the thin film on the wiring (the pattern film).

In this experiment, a wiring with an average film thickness of 3,000 Å was formed between thin films of photosensitive resin (thin film resists) with various film thickness formed on the substrate and then films of inorganic material were formed with an average film thickness of 3,000 to 3,500 Å on the wiring and the state of crack occurrence in the thin films of the inorganic material (upper layer inorganic films) was evaluated. Hereinafter, details of this experiment will be described.

At first, by a spin-coating method, a negative type photosensitive resin having lyophobicity (resin solid matter in the proportion of 10 to 30% by weight) was applied on a transparent substrate and then patterned by a photolithographic method. As samples for this experiment, a plurality of samples were produced by changing the thickness and formation patterns of the thin films of the photosensitive resin (thin film resists). In this case, the average thickness of the thin films of the photosensitive resin (thin film resists) were adjusted so as to give the various average thickness values as shown in the following Table 1 by adjusting the dilution of coating solutions by solvents and/or adjusting spin rotation speed. With respect to the formation patterns of the thin film resists, the respective types of the samples were produced while the gap S between the thin film resists (corresponding to the formation width of a wiring) and the width L of the thin film resists being changed to be 10/10, 20/20, 30/30, 50/50, and 100/100 (unit: μm) for L/S.

Next, by an ink-jet method, the gaps between the thin film resists on the transparent substrate were filled with a silver (Ag)-containing colloidal solution (a carbitol type solvent was used for the solvent) and then baking was carried out at 300° C. for about 1 hour to form a wiring with an average thickness of 3,000 Å between the thin film resists. Successively, the thin film resists adjacent to the wiring were separated from the transparent substrate and the wiring. The remaining wiring has a cross-sectional shape composed of a semi-elliptical circular upper part and a forward or approximately vertical taper shaped lower part and the height of the forward or approximately vertical taper shaped lower part was approximately same as the thickness of the separated thin film resists. The width of the wiring was also approximately same as the gaps between the patterned thin film resists.

Finally, a thin film of inorganic material $SiN_x$ with an average thickness of 3,000 to 3,500 Å was formed on the wiring and the state of crack occurrence in the thin film was investigated. The results are shown in the following Table 1.

TABLE 1

| Film thickness of thin film resist/Å | State of crack occurrence | Remarks |
|---|---|---|
| 10 | — | difficult to form thin film resist |

TABLE 1-continued

| Film thickness of thin film resist/Å | State of crack occurrence | Remarks |
|---|---|---|
| 30 | — | slightly difficult to form thin film resist |
| 50 | ○ (no crack) | no particular problem occurred |
| 300 | ○ | no particular problem occurred |
| 800 | ○ | no particular problem occurred |
| 1500 | ○ | no particular problem occurred |
| 2000 | ○ | no particular problem occurred |
| 2500 | ○ | slightly difficult to separate resist |
| 3000 | ○ | slightly difficult to separate resist |
| 3500 | Δ (cracking occurred partially) | difficult to separate resist |
| 4000 | Δ | difficult to separate resist |
| 6000 | Δ | difficult to separate resist |
| 8000 | x (cracking occurred) | difficult to separate resist |
| 15000 | x | difficult to separate resist |

As shown in Table 1, in the case where the film thickness of the thin film resists (the height of the lower part of the wiring) was set less than 50 Å, formation of the thin film resists with such a thin thickness was also difficult. Accordingly, the wiring was difficult to be formed and therefore it was meaningless to evaluate the occurrence of the cracks in the thin film of the inorganic material. Also, in the case of setting the film thickness of 50 Å or larger and 3,000 Å or smaller, no crack was formed in the thin film of the inorganic material and the formation and separation of the thin film resists were carried out without any particular problem. Further, in the case of setting the film thickness of 3,500 Å or larger, separation of the thin film resists from the transparent substrate became difficult and cracks in the thin film of the inorganic material were found.

These results were found depending on the film thickness of the thin film resists and irrelevant to the gap between the thin film resists (the width of the wiring).

(Experiment 2)

This experiment was carried out for confirming the correlation between the average film thickness of a wiring (a pattern film), and both the state of crack occurrence in a thin film on the wiring (the pattern film) and the formation state of the wiring.

In this experiment, a wiring with an average film thickness varied variously (from 1,500 to 10,000 Å) was formed between thin film resists with an average film thickness of 1,500 Å or 3,000 Å on the substrate, and then a film of inorganic material $SiN_x$ with an average film thickness of 3,000 to 3,500 Å was formed on the wiring and the state of crack occurrence in the thin film of the inorganic material was evaluated. The results are shown in the following Table 2.

In addition, the formation of the thin film resists and the wiring was carried out in the same manner as that of Experiment

TABLE 2

| Film thickness of thin film resist/Å | Average film thickness of wiring/Å | State of crack occurrence | State of a wiring |
|---|---|---|---|
| 1500 | 1500 | ○ (no crack) | wiring resistance was high |
|  | 2000 | ○ | no particular problem |

TABLE 2-continued

| Film thickness of thin film resist/Å | Average film thickness of wiring/Å | State of crack occurrence | State of a wiring |
|---|---|---|---|
|  | 3000 | ○ | no particular problem |
|  | 6000 | ○ | no particular problem |
|  | 8000 | — | metal colloidal solution spread over resist region |
|  | 10000 | — | metal colloidal solution spread over resist region |
| 3000 | 1500 | ○ | wiring resistance was high |
|  | 2000 | ○ | no particular problem |
|  | 3000 | ○ | no particular problem |
|  | 6000 | ○ | no particular problem |
|  | 8000 | — | metal colloidal solution spread over resist region |
|  | 10000 | — | metal colloidal solution spread over resist region |

As shown in Table 2, in the case where the average film thickness of the photosensitive resin was kept constantly 1,500 Å, if the average film thickness of the wiring was set to be 1,500 Å, no crack occurrence was observed in the thin film of the inorganic material, however the wiring resistance was high. If the average film thickness of the wiring was set to be 2,000 Å or larger and 6,000 Å or smaller, no crack occurrence was observed in the thin film of the inorganic material and also the wiring resistance was sufficiently low. Further, if the average film thickness of the wiring was set to be 8,000 Å or larger, the metal colloidal solution spread over the photosensitive resin to make formation of the wiring impossible. Therefore, crack occurrence in the thin film of the inorganic material could not be evaluated.

These results were also found depending on the film thickness of the photosensitive resin and irrelevant to the gap between the thin film resists (the width of the wiring).

Further, as shown in Table 2, in the case where the average film thickness of the photosensitive resin was fixed to be 3,000 Å, similar results were obtained.

Comparative Example 1

FIG. 5 is a schematic cross-sectional view showing one example of formation flow of a wiring in the case of applying a previous sputtering method to formation of a gate wiring.

Figure 5A:
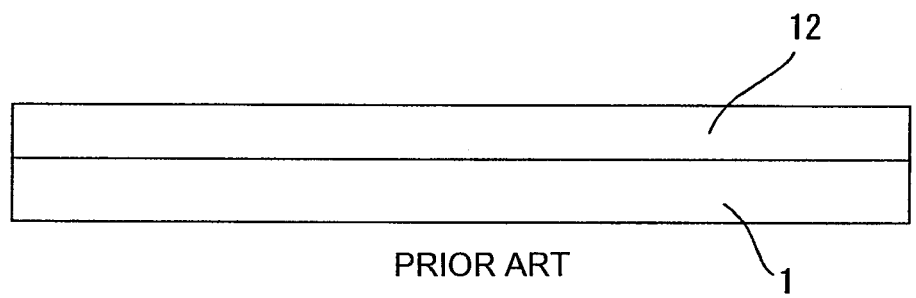
FIG. 5A is a schematic cross-sectional view showing one example of a formation flow of a wiring in the case of applying a previous sputtering method to formation of a gate wiring (at the time of forming a metal film).
Figure 5B:
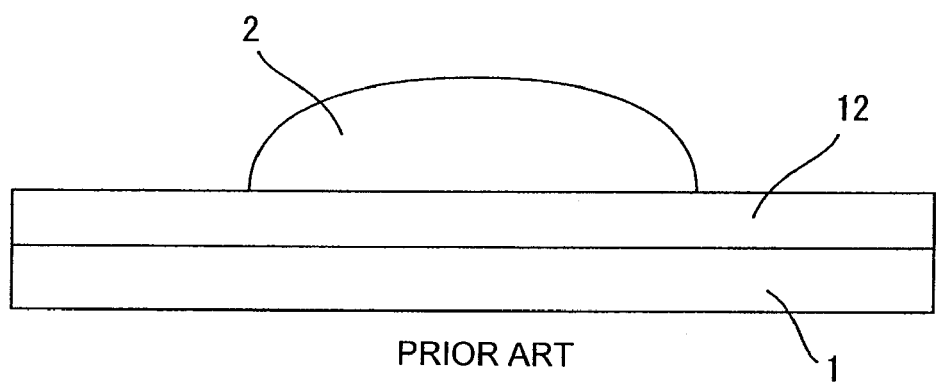
FIG. 5B is a schematic cross-sectional view showing one example of a formation flow of a wiring in the case of applying a previous sputtering method to formation of a gate wiring (at the time of forming a photosensitive resin pattern).
Figure 5C:
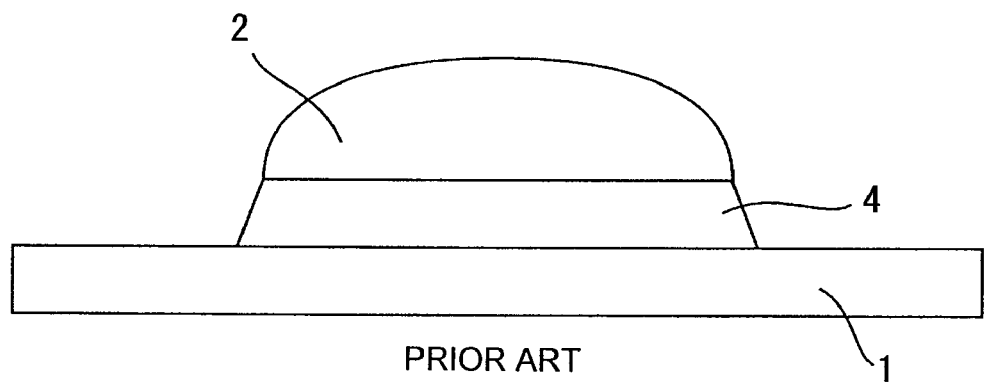
FIG. 5C is a schematic cross-sectional view showing one example of a formation flow of a wiring in the case of applying a previous sputtering method to formation of a gate wiring (at the time of etching a metal layer).
Figure 5D:
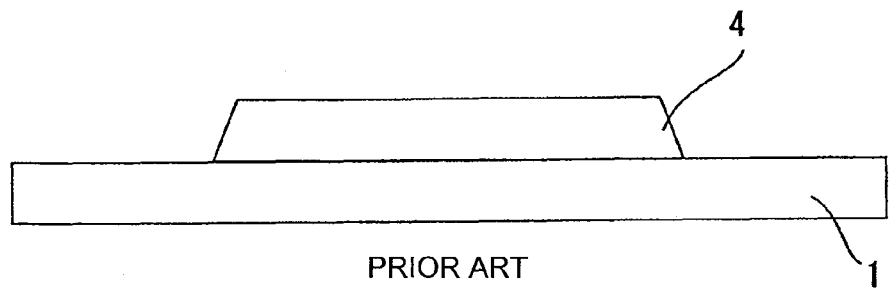
FIG. 5D is a schematic cross-sectional view showing one example of a formation flow of a wiring in the case of applying a previous sputtering method to formation of a gate wiring (at the time of removing a photosensitive resin).

In formation flow of a gate wiring by a previous sputtering method, after at first a metal film 12 with an average film thickness of 5,000 Å is formed on a transparent substrate 1 by a sputtering method (reference to FIG. 5A), a photosensitive resin 2 is formed with a desired pattern by a photolithographic method (reference to FIG. 5B). Next, the metal film 12 is etched into the pattern shape of the photosensitive resin 2 to form a metal wiring 4 (reference to FIG. 5C). After that, the photosensitive resin 2 is removed to complete formation of the gate wiring 4 (reference to FIG. 5D).

Figure 6A:
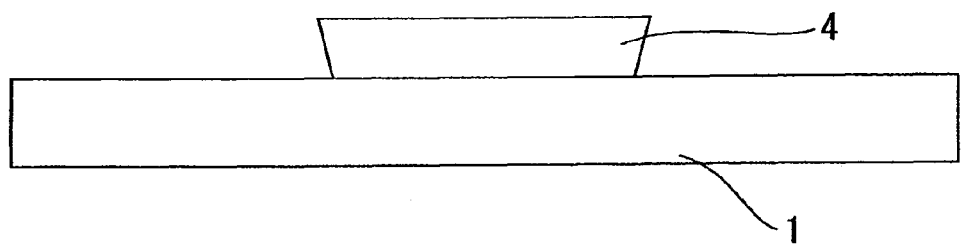
FIG. 6A is a schematic cross-sectional view in the case of forming a gate wiring by a previous sputtering method (Comparative Example 1).
Figure 6B:
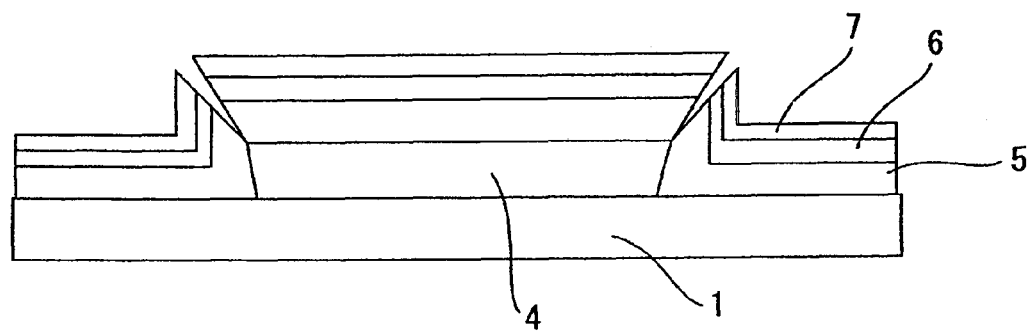
FIG. 6B is a schematic cross-sectional view for explaining the state that the cracks occur in the upper layer of the gate wiring in the case of applying a previous sputtering method to formation of a gate wiring (Comparative Example 1).

However, in formation flow of a wiring of Comparative Example 1, as shown in FIG. 6A, if particularly the film thickness of a wiring becomes large, it becomes difficult to control the tapered shape of the wiring and the cross-sectional shape of the gate wiring 4 tends to be inverse tapered shape and in the case where a gate insulator 5/semiconductor layer 6/contact layer 7 are formed on such the gate wiring 4, the step coverage is deteriorated and as shown in FIG. 6B, cracks tend to be occurred in the gate insulator 5/semiconductor layer 6/contact layer 7. On the contrary, in Examples 1 and 2, even if the film thickness of a wiring is large, since the shape of the upper part of a wiring is a upward convex plano-convex lens-like shape, the step coverage of upper film is good.

Comparative Example 2

Figure 7A:
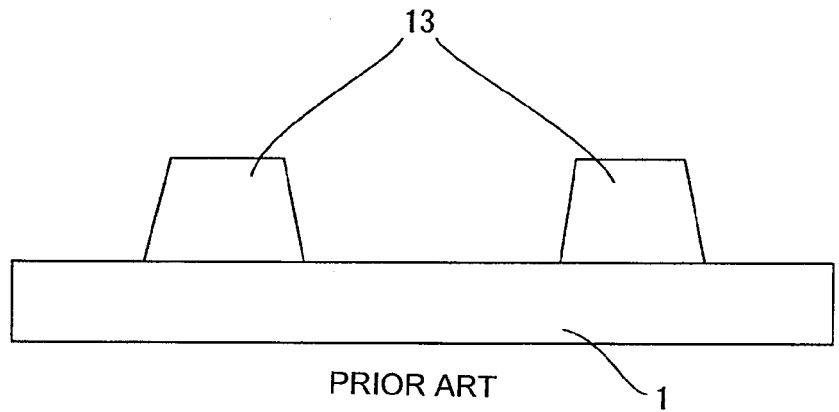
FIG. 7A is a schematic cross-sectional view showing one example of a formation flow of a wiring in the case of applying a previous ink-jet method using a guide material to formation of a gate wiring (at the time of forming a guide material pattern).

FIG. 7 is a schematic cross-sectional view showing one example of formation flow of a wiring in the case of applying a previous ink-jet method using a guide material to formation of a gate wiring.

Figure 7B:
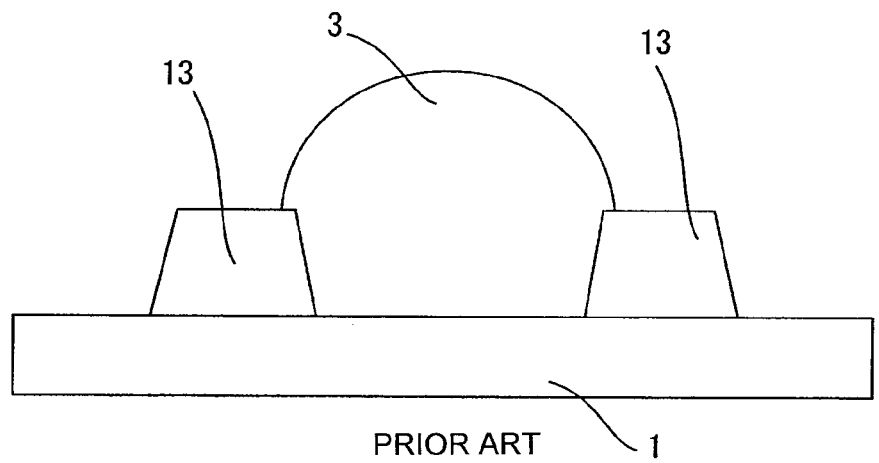
FIG. 7B is a schematic cross-sectional view showing one example of a formation flow of a wiring in the case of applying a previous ink-jet method using a guide material to formation of a gate wiring (at the time of disposing a colloidal solution).
Figure 7C:
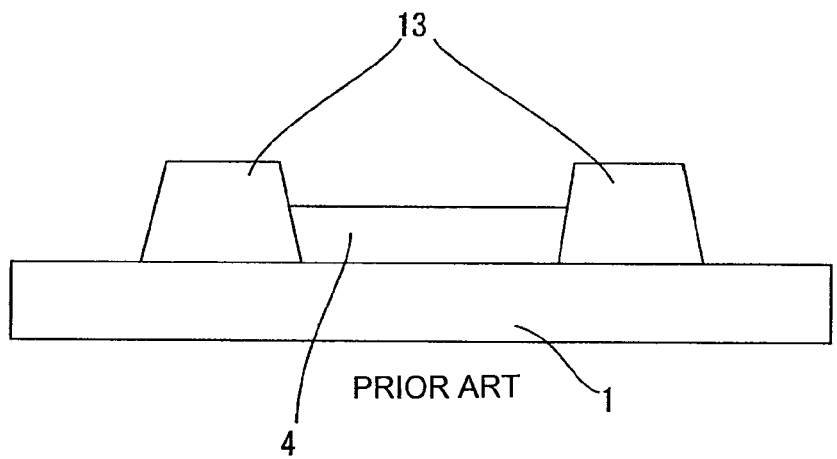
FIG. 7C is a schematic cross-sectional view showing one example of a formation flow of a wiring in the case of applying a previous ink-jet method using a guide material to formation of a gate wiring (at the time of forming a metal wiring).

In formation flow of a gate wiring by a previous ink-jet method using a guide material, at first a guide material 13 of photosensitive resin is formed on a transparent substrate 1 in a pattern as desired by a photolithographic method, thereafter the guide material 13 is provided with lyophobicity by plasma treatment using fluorine-based gas (reference to FIG. 7A) and the region where the guide material 13 is not formed is filled with a colloidal solution 3 containing silver (Ag), copper (Cu) or alloy thereof by an ink-jet method, a spin-coating method, or a dipping method (reference to FIG. 7B). After that, the solution is baked at 300° C. for about 1 hour to form a metal wiring 4 with an average film thickness of 3,000 Å (reference to FIG. 7C) and then the guide material 13 is removed to complete formation of the gate wiring 4.

Figure 8A:
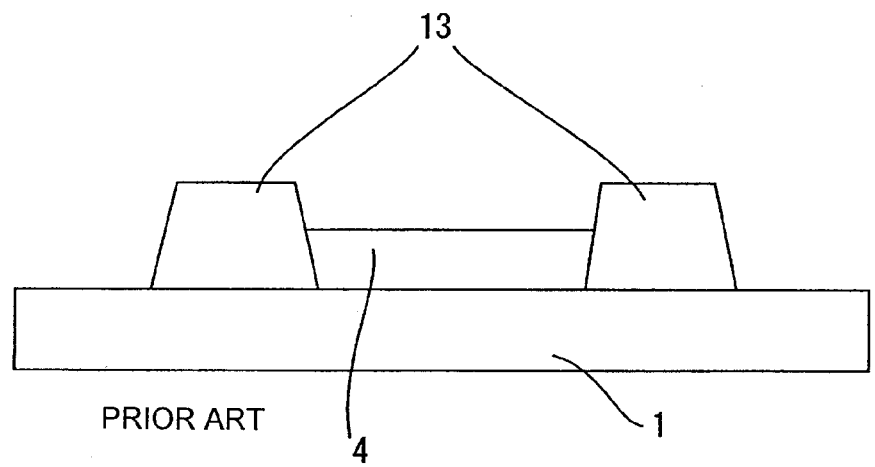
FIG. 8A is a schematic cross-sectional view in the case of forming a gate wiring by a previous ink-jet method using a guide material (Comparative Example 2).
Figure 8B:
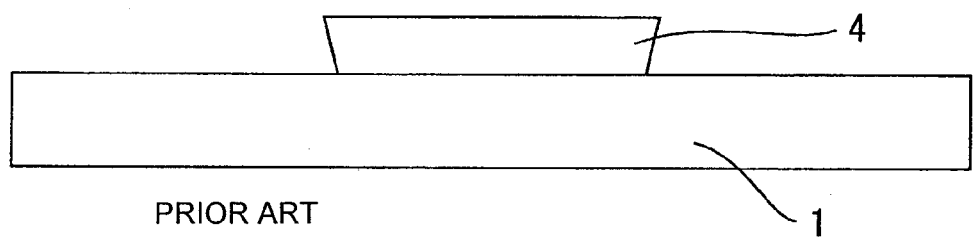
FIG. 8B is a schematic cross-sectional view in the case of forming a gate wiring by a previous ink-jet method using a guide material and removing the guide material (Comparative Example 2).
Figure 8C:
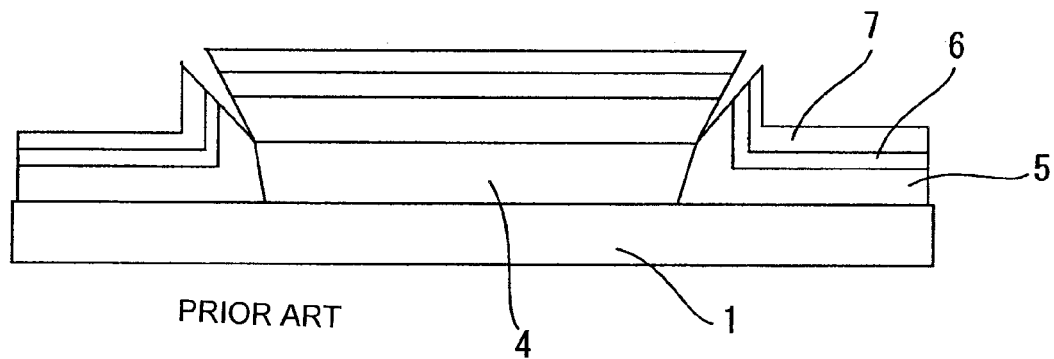
FIG. 8C is a schematic cross-sectional view for explaining the state that the cracks are formed in the upper layer of the gate wiring in the case of forming the gate wiring by a previous ink-jet method using a guide material and removing the guide material (Comparative Example 2).

However, in formation flow of a wiring of Comparative Example 2, as shown in FIG. 8A, since the cross-sectional shape of the guide material 13 is a forward tapered shape, as shown in FIG. 8B, the cross-sectional shape of the gate wiring 4 tends to be inverse tapered shape and in the case the guide material 13 is removed, when a gate insulator 5/semiconductor layer 6/contact layer 7 is formed on the gate wiring 4, the step coverage is deteriorated and as shown in FIG. 8C, cracks tend to be formed in the gate insulator 5/semiconductor layer 6/contact layer 7. Further, the guide material 13 generally has an average film thickness of 1 μm or larger and is thus difficult to be removed. On the contrary, in Examples 1 and 2, even if the thin film of the photosensitive resin 2 is removed, the film thickness of the step part is thin and therefore, the step coverage is good and also since the average film thickness is as thin as 1,500 Å or thinner, the thin film of photosensitive resin can be removed easily.

Figure 9A:
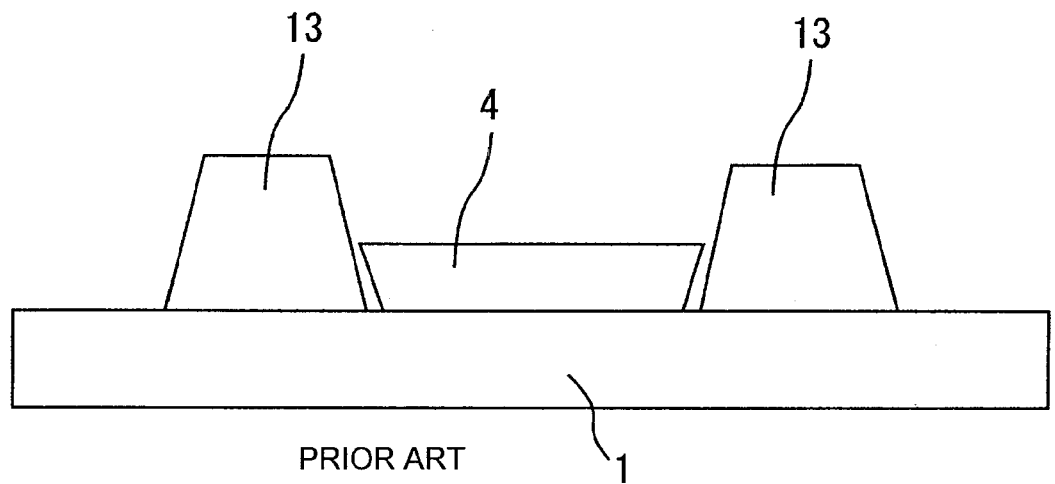
FIG. 9A is a schematic cross-sectional view in the case of forming a gate wiring by a previous ink-jet method using a guide material and not removing the guide material (Comparative Example 2).
Figure 9B:
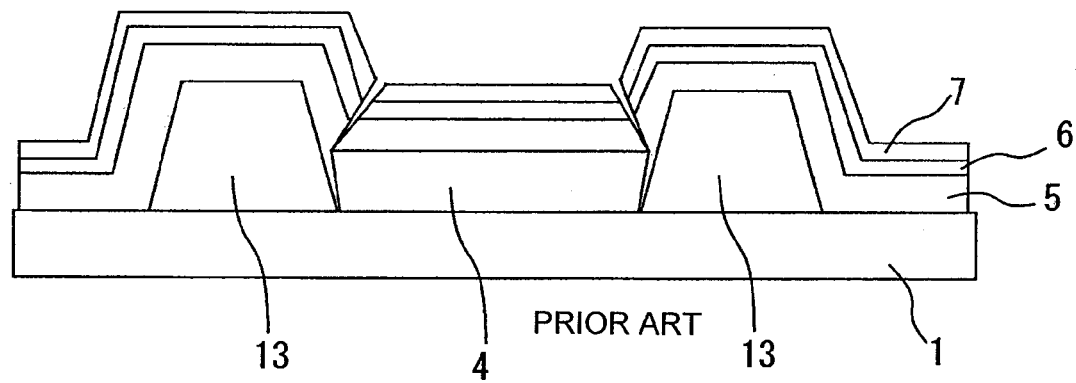
FIG. 9B is a schematic cross-sectional view for explaining the state that the cracks are formed in the upper layer of the gate wiring in the case of forming the gate wiring by a previous ink-jet method using a guide material and not removing the guide material (Comparative Example 2).

On the other hand, in the case the guide material 13 is not removed, as shown in FIG. 9A, since a gap tends to be formed between the gate wiring 4 and the guide material 13 after the baking, when a gate insulator 5/semiconductor layer 6/contact layer 7 is formed on the gate wiring 4, the step coverage is deteriorated and as shown in FIG. 9B, cracks tend to be formed in the gate insulator 5/semiconductor layer 6/contact layer 7. Further, in the case an organic resin is used for the guide material 13, a gas is emitted at the time of film formation of the gate insulator 5/semiconductor layer 6/contact layer 7 to deteriorate the film quality. On the contrary, in Examples 1 and 2, since the thin film of the photosensitive resin 2 is removed, when the gate insulator 5/semiconductor layer 6/contact layer 7 is formed as an upper layer, cracking scarcely occurs and no gas emission is caused at the time of film formation of the gate insulator 5/semiconductor layer 6/contact layer 7.

Comparative Example 3

FIG. 10 is a schematic cross-sectional view showing one example of formation flow of a wiring in the case of applying a previous ink-jet method using a monomolecular film to formation of a gate wiring.

Figure 10A:
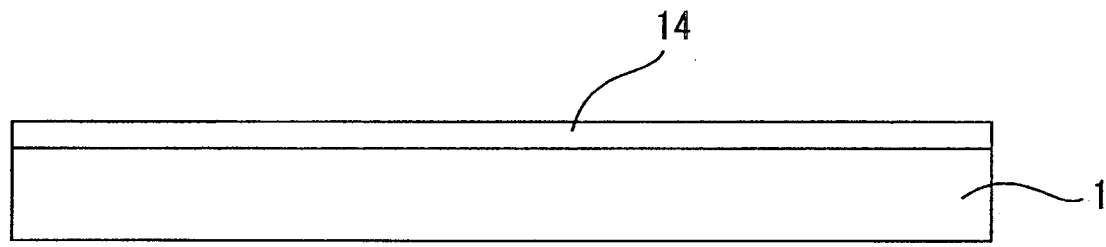
FIG. 10A is a schematic cross-sectional view showing one example of a formation flow of a wiring in the case of applying a previous ink-jet method using a monomolecular film to formation of a gate wiring (at the time of forming a monomolecular film).
Figure 10B:
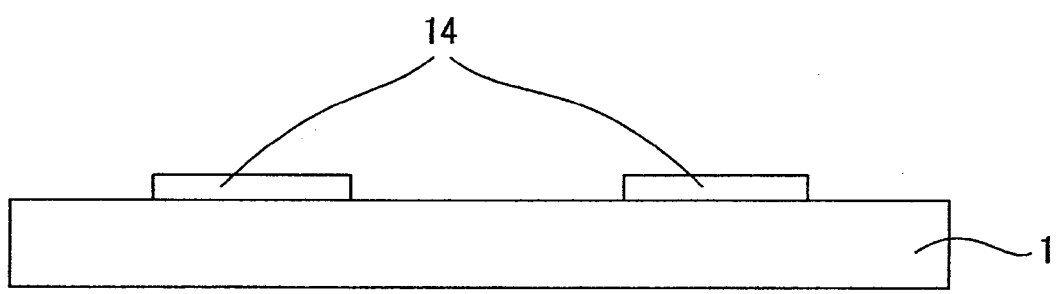
FIG. 10B is a schematic cross-sectional view showing one example of a formation flow of a wiring in the case of applying a previous ink-jet method using a monomolecular film to formation of a gate wiring (at the time of patterning a monomolecular film).
Figure 10C:
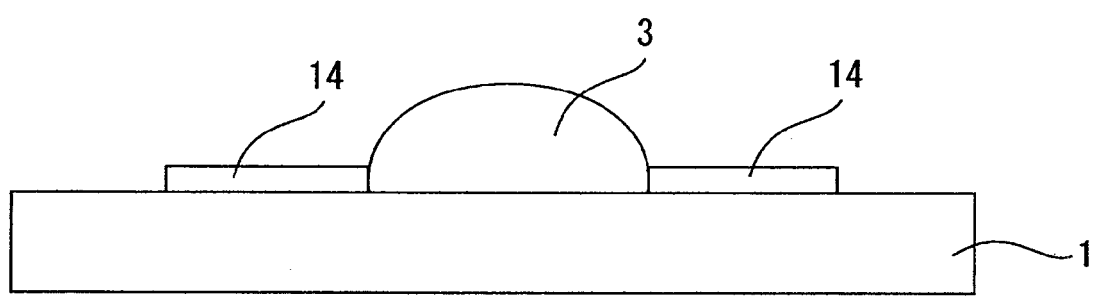
FIG. 10C is a schematic cross-sectional view showing one example of a formation flow of a wiring in the case of applying a previous ink-jet method using monomolecular film to formation of a gate wiring (at the time of disposing a colloidal solution).
Figure 10D:
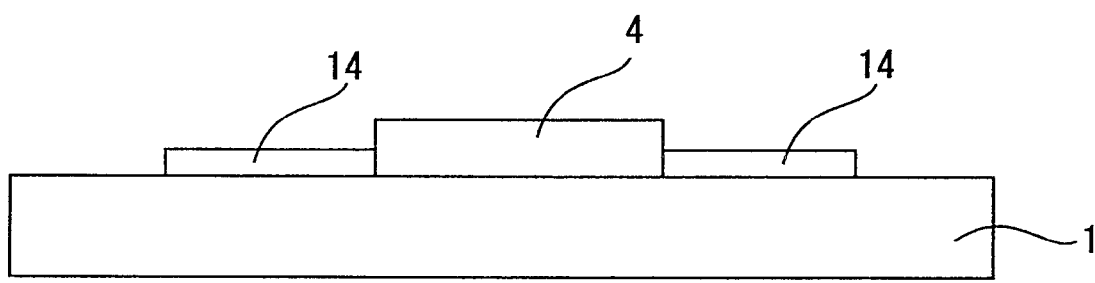
FIG. 10D is a schematic cross-sectional view showing one example of a formation flow of a wiring in the case of applying a previous ink-jet method using monomolecular film to formation of a gate wiring (at the time of forming a metal wiring).

In formation flow of a wiring in the case of applying a previous ink-jet method using a monomolecular film, at first, a monomolecular film 14 is formed on a transparent substrate 1 (reference to FIG. 10A) and then the monomolecular film 14 is patterned in a desired pattern by light energy (reference to FIG. 10B). Next, the region where the monomolecular film 14 is not formed is filled with a colloidal solution 3 containing silver (Ag), copper (Cu) or alloy thereof by an ink-jet method, a spin-coating method, or dipping method (reference to FIG. 1C). After that, the solution is baked at 300° C. for about 1 hour to form a metal wiring 4 with an average film thickness of 3,000 Å (reference to FIG. 10D) and then the monomolecular film 14 is removed to complete formation of the gate wiring 4.

However, pattering of the monomolecular film 14 is difficult and generally it is required to radiate UV rays with wavelength of 170 to 254 nm and energy dose of several tens of mJ/cm$^2$ by excimer laser or the like to considerably worsen the productivity. On the contrary, in Examples 1 and 2, since the thin film of the photosensitive resin 2 is used, patterning can easily be carried out by light with near blue wavelength range to result in high productivity.

This nonprovisional application claims priority under 35 U.S.C. §119 (a) on Patent application No. 2004-136 filed in Japan on Apr. 30, 2004 and No. 2004-360399 filed in Japan on Dec. 13, 2004, the entire contents of which are hereby incorporated by references.

The invention claimed is:

1. A component placement substrate comprising one or more pattern films on a substrate, wherein at least one of the pattern film(s) has a cross-sectional shape composed of a semi-elliptical circular upper part, and one of a forward taper-shaped lower part and an approximately vertical taper-shaped lower part and the average thickness of the lower part is 50 Å or larger and 3,000 Å or smaller.

2. The component placement substrate according to claim 1, wherein the pattern film(s) is at least one kind of film(s) selected from a group consisting of a wiring, an electrode, an insulating layer, and a functional film.

3. The component placement substrate according to claim 1, wherein at least one of the pattern film(s) has an average film thickness of 2,000 Å or larger.

4. The component placement substrate according to claim 1, wherein at least one of the pattern film(s) is formed by applying a liquid material to the inside of a guide pattern composed of a thin film of resist.

5. The component placement substrate according to claim 1, wherein at least one of the pattern film(s) is covered with a thin film of inorganic material.

6. The component placement substrate according to claim 5, wherein the thin film of the inorganic material is formed by a vacuum evaporation method or a chemical vapor deposition method.

7. A display apparatus comprising the component placement substrate according to claim 1.

8. The display apparatus according to claim 7 being a liquid crystal display apparatus.

* * * * *